(12) United States Patent
Furukawa

(10) Patent No.: US 7,413,605 B2
(45) Date of Patent: Aug. 19, 2008

(54) METHOD FOR MANUFACTURING SILICON SINGLE CRYSTAL

(75) Inventor: Jun Furukawa, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/553,854

(22) Filed: Oct. 27, 2006

(65) Prior Publication Data

US 2007/0095275 A1    May 3, 2007

(30) Foreign Application Priority Data

Oct. 31, 2005    (JP) .............................. 2005-316473

(51) Int. Cl.
*C30B 15/20*    (2006.01)
(52) U.S. Cl. ..................... 117/14; 117/18; 117/201; 117/202
(58) Field of Classification Search .............. 117/14, 117/18, 201, 202, 932
See application file for complete search history.

(56) References Cited

U.S. PATENT DOCUMENTS 6,416,576 B1 * 7/2002 Mizuta et al. ................ 117/20
7,074,271 B2 * 7/2006 Furukawa et al. ............. 117/13
7,195,669 B2 * 3/2007 Wakabayashi et al. ........ 117/17

* cited by examiner

*Primary Examiner*—Felisa Hiteshew
(74) *Attorney, Agent, or Firm*—Duane Morris LLP

(57) ABSTRACT

By pulling up an ingot in consideration of deformation of a crucible, generation of the defective ingot is prevented and a plurality of ingots having equivalent quality with the first ingot are pulled up in a multiple pull-up. Firstly, a deformation amount of a crucible for experiment (34) upon melting a silicon raw material and a history of supply power to a heater for experiment (38) are measured to calculate deformation tendency of a crucible for mass production (14). Next, the size of the crucible for mass production is measured, the silicon raw material of the amount equivalent to the amount supplied to the crucible for experiment is melted with a heater for mass production (18), and an initial crucible external position with a predetermined gap (X) is measured before initiating pull-up. Moreover, the deformation amount of the crucible for mass production upon melting the silicon raw material is predicted based on such as a relation between the deformation tendency of the crucible for experiment and the initial crucible external position, an initial crucible internal position when the predetermined gap is provided is predicted based on the deformation amount of the crucible for mass production, and an optimal pulling-up speed of the ingot is derived from predictive calculation to initiate the pull-up of the ingot at the optimal pulling-up speed.

9 Claims, 5 Drawing Sheets

METHOD FOR MANUFACTURING SILICON SINGLE CRYSTAL

BACKGROUND OF THE INVENTION

1. Field of the Invention

The present invention relates to a method for manufacturing a defect-free silicon single crystal ingot, namely, the single crystal ingot of pure silicon, by pulling up the ingot using the Czochralski method (hereinafter, the CZ method).

2. Description of the Related Art

Factors which reduce a yield of a device, due to extreme-miniaturization of semiconductor integrated circuits in recent years, include a crystal originated particle (hereinafter, referred to as the COP) originating from a crystal, a minute defect of an oxygen precipitate which is to be a nucleus of an oxidation induced stacking fault (hereinafter, referred to as the OSF), or presence of an interstitial-type large dislocation (hereinafter, referred to as L/D).

The COP is a pit, which appears on a wafer surface when a mirror-ground silicon wafer is washed with a mixed solution of ammonia and hydrogen peroxide. When this wafer is measured by a particle counter, this pit is detected as the particle. This pit originates from the crystal The COP would be a factor to degrade a time dependent dielectric breakdown (TDDB) of an oxide film, a time zero dielectric breakdown (TZDB) of the oxide film, or the like. In addition, if the COP is present on the wafer surface, a step may be produced upon wiring process of the device, causing disconnection. It may also cause leakage or the like at a device isolation portion, degrading the yield of a product.

Minute oxygen precipitate nuclei are introduced into the silicon single crystal while the crystal being grown. The OSF is a defect formed by actualizing the nuclei at thermal oxidation process or the like upon manufacturing a semiconductor device. This OSF causes a failure such as leakage current of the device being increased. The L/D is also referred to as a dislocation cluster or a dislocation pit, because the pit is generated when the defective silicon wafer is immersed in a selective etching liquid including fluoric acid as a major component. This L/D also causes the degradation in electrical properties, e.g., a leak property, an isolation property, or the like. From the above, it is necessary to reduce the COP, the OSF, and the L/D in the silicon wafer used to manufacture the semiconductor integrated circuit.

A method for manufacturing the defect-free silicon single crystal wafer, which does not have the COP, the OSF, and the L/D, is disclosed (for example, see Patent Document 1). The method for manufacturing the defect-free silicon single crystal wafer comprises a step of pulling up the ingot from a silicon melt in a hot zone furnace at a pulling-up speed profile, which is high enough so as to prevent interstitial bulk (agglomerates of an interstitial silicon type point defect) and low enough so as to limit vacancy bulk (agglomerates of an vacancy type point defect) within a vacancy-rich region along the axial direction of the ingot. For this reason, where the pulling-up speed of the ingot is V (mm/min.) and a temperature gradient in the axial direction near a solid-liquid interface of the silicon melt and the ingot is G (° C./mm), a plurality of wafers constituted of a defect-free region, in which the agglomerates of the vacancy type point defect and the agglomerates of the interstitial silicon type point defect are not present, can be manufactured from one ingot by precisely controlling V/G.

From the described above, it can be understood that the defect-free ingot is made within a range of V/G (mm$^2$/min. ° C.), where the OSF (P band), which is generated in a ring form when the thermal oxidation is performed, disappears at the center of the wafer and the L/D (B band) is not generated. In order to improve the productivity, the yield, or the like of the defect-free ingot, it is required to expand a width of the pulling-up speed of the ingot, namely, a pure margin, for producing the defect-free region in the pulling-up direction and radial direction of the ingot. The pure margin is considered to have some correlation with a shape of the solid-liquid interface upon pulling up the ingot Thus, methods of using the shape of the solid-liquid interface as a control factor for manufacturing the defect-free ingot have been studied, and a method for manufacturing the defect-free ingot by considering the shape of the solid-liquid interface of the silicon melt and the silicon single crystal ingot is disclosed (for example, see Patent Document 2). In the method for manufacturing the defect-free ingot, the defect-free ingot can be manufactured with stability and sufficient repeatability by appropriately adjusting the relation between the shape of the solid-liquid interface, which is the interface between the silicon melt and the silicon single crystal ingot, and temperature distribution on a side of the ingot being pulled up.

[Patent Document 1] Japanese Unexamined Patent Publication No. 11-1393 corresponding to U.S. Pat. No. 6,045,610 (claim 1, paragraph [0116])

[Patent Document 2] Japanese Unexamined Patent Publication No. 2001-261495 (claim 1, paragraph [0148])

However, in the conventional methods described above, namely, the method for manufacturing the defect-free silicon single crystal wafer described in Japanese Unexamined Patent Publication No. 11-1393 corresponding to U.S. Pat. No. 6,045,610 or the method for manufacturing the defect-free ingot described in Japanese Unexamined Patent Publication No. 2001-261495, deformation of a crucible storing the silicon melt is not taken into consideration, so that there has been a failure that a defective portion is generated inside the ingot even when a gap between the surface of the silicon melt and a bottom end of a thermal shield member encircling the ingot being pulled up is set to a predetermined value. Specifically, since the crucible is deformed when silicon material supplied to the crucible is melted with a heater, causing a peripheral wall of the crucible becoming thinner and a height thereof becoming low as well as a bottom wall of the crucible becoming thick, a position of the crucible in the vertical direction with respect to the heater is displaced even when the gap between the surface of the silicon melt and the bottom end of the thermal shield member is set to the predetermined value. For this reason, the temperature gradient G near the solid-liquid interface between the silicon melt and the ingot is changed and thus V/G is shifted from the condition for pulling up the defect-free ingot when the pulling-up speed V of the ingot is fixed, so that there has been a problem that a defective portion is generated inside the ingot.

Meanwhile, in order to reduce the manufacture cost of the silicon single crystal ingot, a so-called multiple pull-up method, wherein a plurality of ingots are pulled up using the same crucible, may be adopted. In the multiple pull-up method, the deformation of the crucible becomes larger as the number of the pulled up ingots increases, so that there has been a problem that the defective portion generated inside the ingot increases whenever the number of the pulled up ingots increases

SUMMARY OF THE INVENTION

An object of the present invention is to provide the method manufacturing for the silicon single crystal which can prevent the generation of the defective ingot by pulling up the silicon single crystal ingot in consideration of the deformation of the crucible, particularly, when the pulling-up is performed by the multiple pull-up method, which can pull up the plurality of ingots having an quality equivalent to that of the ingot pulled up first in consideration of the deformation of the crucible.

The invention according to claim 1 is, as illustrated in FIGS. 1 and 2, an improvement of a method for manufacturing a silicon single crystal for supplying a predetermined amount of a silicon raw material to a crucible for mass production 14 of a silicon single crystal pulling-up apparatus 10, followed by melting the silicon raw material with a heater for mass production 18 to store a silicon melt 13 in the crucible for mass production 14, pulling up a silicon single crystal ingot 11 from the silicon melt 13 stored in the crucible for mass production 14, and encircling the ingot 11 being pulled up by a heat shield member 24 disposed above a surface of the silicon melt 13 with a predetermined gap X therewith.

The characteristic configuration thereof is to comprise the steps of calculating deformation tendency of the crucible for mass production 14 by measuring a deformation amount of a crucible for experiment 34 and a history of supply power to a heater for experiment 38 when the silicon raw material of the amount equivalent to the amount supplied to the crucible for mass production 14 is supplied to the crucible for experiment 34 having shape and size equivalent to those of the crucible for mass production 14 and then the silicon raw material is melted with the heater for experiment 38 having shape and size equivalent to those of the heater for mass production 18; measuring a size of the crucible for mass production 14 before supplying the silicon raw material to the crucible for mass production 14; measuring a storage amount of the silicon melt 13 by melting the predetermined amount of the silicon raw material supplied to the crucible for mass production 14 with the heater for mass production 18, and measuring the history of the supply power to the heater for mass production 18 upon melting the silicon raw material; measuring an initial crucible external position with respect to the vertical direction external to the crucible for mass production 14 when the crucible for mass production 14 is moved in the vertical direction to locate a surface of the silicon melt 13 below a bottom end of the heat shield member 24 with the predetermined gap X therewith; predicting the deformation amount of the crucible for mass production 14 upon melting the silicon raw material based on the deformation tendency of the crucible for mass production 14 calculated by the crucible for experiment 34 and the heater for experiment 38, the size of the crucible for mass production 14, the storage amount of the silicon melt 13, the history of the supply power to the heater for mass production 18, and the initial crucible external position after melting the silicon raw material; predicting an initial crucible internal position with respect to the vertical direction internal to the crucible for mass production 14 when the predetermined gap X is provided based on the predicted deformation amount of the crucible for mass production 14; setting a setup pulling-up speed by predictively calculating an optimal pulling-up speed of the ingot 11 based on the measured initial crucible external position and the predicted initial crucible internal position; and initiating pull-up of the ingot 11 at the setup pulling-up speed.

In the method described in claim 1, the deformation amount of the crucible for mass production 14 upon melting the silicon raw material is predicted from the deformation tendency of the crucible for mass production 14, the size of the crucible for mass production 14, the storage amount of the silicon melt 13, the history of the supply power to the heater for mass production 18, and the initial crucible external position after melting the silicon raw material, the initial crucible internal position when the predetermined gap X is provided is predicted based on the predicted deformation amount of the crucible for mass production 14, and further the optimal pulling-up speed for pulling up the defect-free ingot 11 is predictively calculated using a computer based on the initial crucible external position and the initial crucible internal position. The optimal pulling-up speed is set as the setup pulling-up speed to initiate the pull-up of the ingot 11. In other words, by performing the predictive calculation of the quality of the ingot 11 using the computer, in consideration of the influence of the deformation of the crucible for mass production 14 to the quality of the ingot 11, upon pulling up the ingot 11, it is predicted whether the defect will be generated in the ingot 11, and the pull-up condition of the ingot 11 where the defect is not generated in the ingot 11 is calculated using the computer. Subsequently, the calculation result is fed back to the pulling-up speed of the ingot 11, so that the ingot 11 is pulled up at the pulling-up speed.

The invention according to claim 2 is the invention according to claim 1, as further illustrated in FIGS. 1 and 2, further comprising the steps of: measuring change in a diameter of the ingot 11 and change in a position of the surface of the silicon melt 13 in the vertical direction during pulling up the ingot 11 at the setup pulling-up speed; modifying the setup pulling-up speed based on the change in the diameter of the ingot 11 and the change in the position of the surface of the silicon melt 13 in the vertical direction; pulling up the ingot 11 at the modified setup pulling-up speed; and repeating the measurement step, the modification step, and the pull-up step during pulling up the ingot 11.

In the method described in claim 2, the predictive calculation of the quality of the ingot 11 is performed for every predetermined time based on the change in the diameter of the ingot 11 and the change in the position of the surface of the silicon melt 13 in the vertical direction during pulling up the ingot 11, and the ingot 11 is pulled up while modifying the setup pulling-up speed. Thereby, the ingot 11, which is defect-free over the entire length, can be pulled up.

The invention according to claim 3 is, as illustrated in FIGS. 1 and 2, the method for manufacturing the silicon single crystal comprising the steps of: when the ingot 11 is dislocated during pulling up the first ingot 11 by the method according to claim 2, remelting the ingot 11 being pulled up with the heater for mass production 18 to remeasure the storage amount of the silicon melt 13 and measuring the history of the supply power to the heater for mass production 18 upon melting the ingot 11 being pulled up; measuring the initial crucible external position with respect to the vertical direction external to the crucible for mass production 14 when the crucible for mass production 14 is moved in the vertical direction to locate the surface of the silicon melt 13 below the bottom end of the heat shield member 24 with the predetermined gap X therewith; predicting the deformation amount of the crucible for mass production 14 upon melting the ingot 11 being pulled up based on the deformation tendency of the crucible for mass production 14 calculated by the crucible for experiment 34 and the heater for experiment 38, the size of the crucible for mass production 14, the storage amount of the silicon melt 13, the history of the supply power to the heater for mass production 18, and the initial crucible external position after melting the ingot 11 being pulled up; predicting the initial crucible internal position with respect to the vertical direction internal to the crucible for mass production 14 when the predetermined gap X is provided based on the predicted deformation amount of the crucible for mass production 14; setting the setup pulling-up speed by predictively calculating the optimal pulling-up speed of the ingot 11 based on the measured initial crucible external position and the predicted initial crucible internal position; and initiating the pull-up of the ingot 11 at the setup pulling-up speed.

In the method described in claim 3, when a crystal habit line of the ingot 11 on the perimeter of the ingot 11 being pulled up disappears and the ingot 11 is dislocated, the deformation amount of the crucible for mass production 14 upon melting the ingot 11 being pulled up is predicted based on the deformation tendency of the crucible for mass production 14 the size of the crucible for mass production 14, the storage amount of the silicon melt 13, the history of the supply power to the heater for mass production 18, and the initial crucible external position after melting the ingot 11 being pulled up, the initial crucible internal position when the predetermined gap X is provided is predicted based on the predicted deformation amount of the crucible for mass production 14, and further the optimal pulling-up speed for pulling up the defect-free ingot 11 is predictively calculated using the computer based on the initial crucible external position and the initial crucible internal position. The optimal pulling-up speed is set as the setup pulling-up speed to initiate the pull-up of the ingot 11. In other words, although the crucible for mass production 14 is deformed when melting the ingot 11 being pulled up with the heater for mass production 18, by performing the predictive calculation of the quality of the ingot 11 using the computer, in consideration of the influence of the deformation of the crucible for mass production 14 to the quality of the ingot 11, it is predicted whether the defect will be generated in the ingot 11, and the pull-up condition of the ingot 11 where the defect is not generated in the ingot 11 is calculated using the computer. Subsequently, the calculation result is fed back to the pulling-up speed of the ingot 11, so that the ingot 11 is pulled up at the pulling-up speed.

The invention according to claim 4 is, as illustrated in FIGS. 1 and 2, an improvement of a pull-up method of the silicon single crystal for pulling up a first ingot 11 by the method according to any one of claims 1 to 3, followed by pulling up a second, third, or more ingot 11 using again the crucible for mass production 14 used for pulling up the first ingot 11.

The characteristic configuration thereof is to comprise the steps of: predicting the deformation amount of the crucible for mass production 14 from deformation tendency of the crucible for mass production 14 calculated from the crucible for experiment 34 and the heater for experiment 38 and pull-up performance of the ingot 11 pulled up previously; remeasuring the storage amount of the silicon melt 13 by supplying the silicon raw material to the crucible for mass production 14 and melting the silicon raw material with the heater for mass production 18, and remeasuring the history of the supply power to the heater for mass production 18 upon melting the silicon raw material; remeasuring the initial crucible external position with respect to the vertical direction external to the crucible for mass production 14 when the crucible for mass production 14 is moved in the vertical direction to locate the surface of the silicon melt 13 below the bottom end of the heat shield member 24 with the predetermined gap X therewith; re-predicting the deformation amount of the crucible for mass production 14 upon melting the silicon raw material based on the predicted deformation amount of the crucible for mass production 14, the remeasured storage amount of the silicon melt 13, the history of the remeasured supply power to the heater for mass production 18, and the remeasured initial crucible external position after melting the silicon raw material; re-predicting the initial crucible internal position with respect to the vertical direction internal to the crucible for mass production 14 when the predetermined gap X is provided based on the re-predicted deformation amount of the crucible for mass production 14; setting the setup pulling-up speed by predictively calculating again the optimal pulling-up speed of the ingot 11 based on the remeasured initial crucible external position and the remeasured initial crucible internal position; and initiating the pull-up of the ingot 11 at the setup pulling-up speed.

In the method described in claim 4, when pulling up the second, third, or more ingot 11 using again the crucible for mass production 14 used for pulling up the first ingot 11, the deformation amount of the crucible for mass production 14 during pulling up the ingot 11 is re-predicted based on the predicted deformation amount of the crucible for mass production 14, the remeasured storage amount of the silicon melt 13, the history of the remeasured supply power to the heater for mass production 18, and the remeasured initial crucible external position after melting the silicon raw material. The initial crucible internal position with respect to the vertical direction internal to the crucible for mass production 14 when the predetermined gap X is provided based on the re-predicted deformation amount of the crucible for mass production 14, the optimal pulling-up speed for pulling up the defect-free ingot 11 is predictively calculated again based on the initial crucible external position and the initial crucible internal position, and the pull-up of the ingot 11 is initiated using the optimal pulling-up speed as the setup pulling-up speed.

The invention according to claim 5 is the invention according to claim 4, as further illustrated in FIGS. 1 and 2, is characterized in further comprising the steps of: measuring change in a diameter of the ingot 11 and change in a position of the surface of the silicon melt 13 in the vertical direction during pulling up the ingot 11 at the setup pulling-up speed; modifying the setup pulling-up speed based on the change in the diameter of the ingot 11 and the change in the position of the surface of the silicon melt 13 in the vertical direction; pulling up the ingot 11 at the modified setup pulling-up speed; and repeating the measurement step, the modification step, and the pull-up step during pulling up the ingot 11.

In the method described in claim 5, the predictive calculation of the quality of the ingot 11 is performed for every predetermined time based on the change in the diameter of the ingot 11 and the change in the position of the surface of the silicon melt 13 in the vertical direction during pulling up the ingot 11, and the ingot 11 is pulled up while modifying the setup pulling-up speed. Thereby, all the ingots 11 pulled up using one crucible for mass production 14 can be defect-free over the entire length.

As described above, according to the present invention, by calculating the deformation tendency of the crucible for mass production by measuring the deformation amount of the crucible for experiment upon melting the silicon raw material and the history of the supply power to the heater for experiment, melting the silicon raw material of the amount equivalent to the amount supplied to the crucible for experiment with the heater for mass production after measuring the size of the crucible for mass production, measuring the initial crucible external position with the predetermined gap provided before initiating the pull-up, predicting the deformation amount of the crucible for mass production upon melting the silicon raw material based on such as the relation between the deformation tendency of the crucible for experiment and the initial crucible external position, predicting the initial crucible internal position when the predetermined gap is provided based on the deformation amount of the crucible for mass production, and further deriving the optimal pulling-up speed of the ingot from the predictive calculation to initiate the pull-up of the ingot at the optimal pulling-up speed, the defect-free ingot can be pulled up. In other words, since the silicon single crystal ingot is pulled up in consideration of the deformation of the crucible, it can prevent the defective ingot being generated.

In addition, when the crystal habit line on the perimeter of the ingot being pulled up disappears and the ingot is dislocated, the ingot being pulled up is melted with the heater for mass production and the ingot is pulled up again from the silicon melt. In this case, before pulling up again the ingot from the silicon melt, by measuring the initial crucible external position with the predetermined gap provided, predicting the deformation amount of the crucible for mass production upon melting the silicon raw material based on such as the relation between the deformation tendency of the crucible for experiment and the initial crucible external position, predicting the initial crucible internal position when the predetermined gap is provided based on the deformation amount of the crucible for mass production, and further deriving the optimal pulling-up speed of the ingot to initiate the pull-up of the ingot at the optimal pulling-up speed, the defect-free ingot can be pulled up as with the method described above.

Moreover, by measuring the change in the diameter of the ingot and the change in the position of the surface of the silicon melt in the vertical direction during pulling up the ingot at the setup pulling-up speed, modifying the setup pulling-up speed based on the change in the diameter of the ingot and the change in the position of the surface of the silicon melt in the vertical direction, pulling up the ingot at the modified setup pulling-up speed, and further repeating the measurement of the change in the gap, the modification of the setup pulling-up speed, and the pull-up at the modified setup pulling-up speed during pulling up the ingot, the ingot which is defect-free over the entire length can be pulled up.

In addition, when pulling up the second, third, or more ingot using again the crucible for mass production used for pulling up the first ingot, by predicting the deformation amount of the crucible for mass production from the deformation tendency of the crucible for mass production and the pull-up performance of the ingot pulled up previously, remeasuring the storage amount of the silicon melt by melting the silicon raw material supplied again to the crucible for mass production with the heater for mass production as well as the history of the supply power to the heater for mass production upon melting the raw material, remeasuring the initial crucible external position with the predetermined gap provided before initiating the pull-up, further re-predicting the deformation amount of the crucible for mass production upon melting the silicon raw material based on such as the predicted deformation amount of the crucible for mass production, repredicting the initial crucible internal position when the predetermined gap is provided based on the deformation amount of the crucible for mass production, and deriving the optimal pulling-up speed of the ingot from the predictive recalculation to initiate the pull-up of the ingot at the optimal pulling-up speed, all the ingots pulled up using one crucible for mass production can be defect-free. As a result, since the silicon single crystal ingot is pulled up in consideration of the deformation of the crucible, a plurality of ingots having the quality equivalent to that of the ingot pulled up first can be pulled up using one crucible for mass production. In other words, it can prevent the defect from being generated for all the ingots pulled up using one crucible for mass production.

Furthermore, by measuring the change in the diameter of the ingot and the change in the position of the surface of the silicon melt in the vertical direction during pulling up the ingot at the setup pulling-up speed, modifying the setup pulling-up speed based on the change in the diameter of the ingot and the change in the position of the surface of the silicon melt in the vertical direction, pulling up the ingot at the modified setup pulling-up speed, and repeating the measurement of the change in the gap, the modification of the setup pulling-up speed, and the pull-up at the modified setup pulling-up speed, all the ingots pulled up from one crucible for mass production can be defect-free over the entire length.

DETAILED DESCRIPTION OF THE PREFERRED EMBODIMENT

Figure 2:
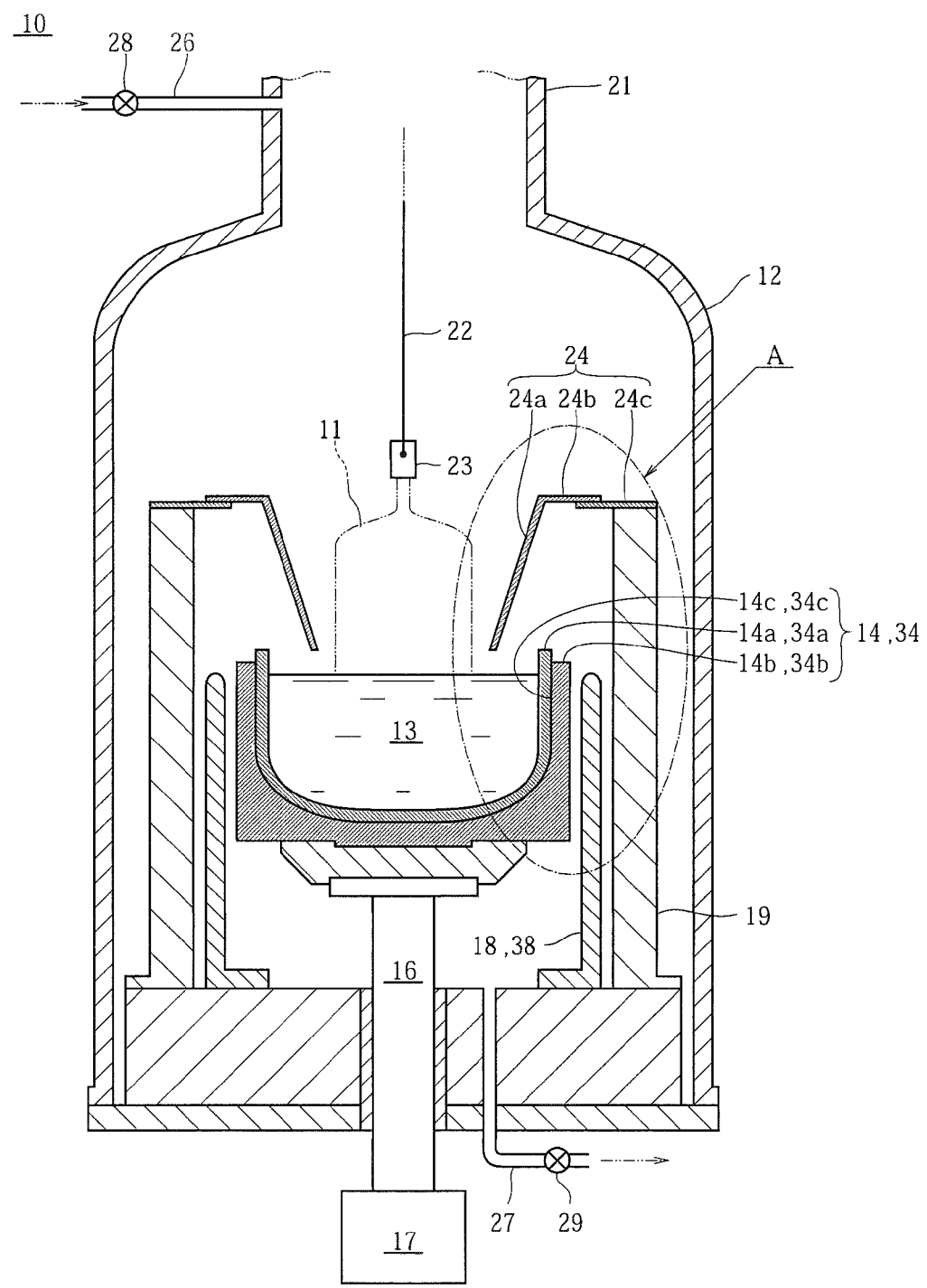
FIG. 2 is a vertical cross section view of the pulling-up apparatus.

Preferred embodiments according to the present invention are disclosed in more details with reference to the attached drawings hereinafter As illustrated in FIG. 2, in a main chamber 12 of a pulling-up apparatus 10 of a silicon single crystal ingot 11, a crucible for mass production 14 which stores a silicon melt 13 is provided. The crucible for mass production 14 has a quartz crucible 14a, formed of quartz and wherein the silicon melt 13 is stored, and a carbon crucible 14b, formed of carbon and having a recessed portion 14c in which the quartz crucible 14a can be inserted, covering a perimeter and a bottom surface of the quartz crucible 14a. The carbon crucible 14b is connected to crucible driving means 17 through a pivot 16, and the crucible driving means 17 is constituted so that it rotates and moves up/down the crucible for mass production 14. The crucible for mass production 14 is encircled with a heater for mass production 18 disposed externally with a predetermined spacing from the perimeter of the carbon crucible 14b, and the heater 18 is encircled with a heat insulation tube 19. The heater for mass production 18 heats and fuses either or both of a silicon polycrystalline substance of high purity and a silicon single crystal as a silicon raw material supplied to the quartz crucible 14a to make the silicon melt 13. In addition, at an upper end of the main chamber 12, a cylindrical pull chamber 21 with a smaller diameter than that of the main chamber 12 is connected. At the upper end of the pull chamber 21, seed pull-up means (not illustrated) is provided, which is constituted so that it rotates and moves up/down a pull-up shaft 22, a lower end thereof reaching a surface of the silicon melt 13 in the main chamber 12. At the lower end of the pull-up shaft 22, a seed chuck 23 is provided, which is constituted to hold a seed crystal (not shown). It is constituted so that, after the lower end of the seed crystal is immersed into the silicon melt 13, the seed crystal and the crucible for mass production 14 are rotated and moved up respectively by the seed pull-up means to pull up and grow the ingot 11 from the lower end of the seed crystal.

Meanwhile, in order to shield heat from the heater for mass production 18 to the ingot 11 pulled up from the silicon melt 13, the ingot 11 is encircled by a heat shield member 24 disposed externally with a predetermined spacing from the perimeter. The heat shield member 24 has a cone section 24*a* formed in a cone shape tapering toward a lower portion, a flange section 24*b* formed successively at an upper edge of the cone section 24*a* and extending outward in the horizontal direction substantially, and a ring board 24*c* for mounting the flange section 24*b* on the heat insulation tube 19. The pull chamber 21 and the main chamber 12 are constituted so that an inert gas, such as an argon gas, flows therein. It is constituted so that the inert gas is introduced into the pull chamber 21 through a gas supply pipe 26 connected to a side wall of the pull chamber 21 and discharged out of the main chamber 12 through a gas discharging pipe 27 connected to a lower wall of the main chamber 12. Reference numeral 28 in FIG. 2 is a supply gas flow regulating valve provided on the gas supply pipe 26 for regulating the flow rate of the inert gas introduced into the pull chamber 21, while reference numeral 29 is a discharge gas flow regulating valve provided on the gas discharging pipe 27 for regulating the flow rage of the inert gas discharged from the main chamber 12.

The method for manufacturing the silicon single crystal ingot 11 using thus constituted pulling-up apparatus 10 will be described based on FIGS. 1 to 5.

Firstly, a crucible for experiment 34 formed of the same material and with the same shape and size as those of the crucible for mass production 14, as well as a heater for experiment 38 formed of the same material and with the same shape and size as those of the heater for mass production 18, are prepared, and the crucible for experiment 34 and the heater for experiment 38 are mounted in the main chamber 12 of the pulling-up apparatus 10 after measurement of the sizes of these members. In this state, a predetermined amount of the silicon raw material is supplied to the crucible for experiment 34, the silicon raw material is melted with the heater for experiment 38 and cooled to the room temperature. After the crucible for experiment 34 is taken out from the main chamber 12, the solidified silicon is taken out from the crucible for experiment 34 to measure a deformation amount of the crucible for experiment 34. Moreover, the ingot 11 is pulled up from the silicon melt 13 in the crucible for experiment 34, and, in consideration of the case where a crystal habit line on the perimeter of the ingot 11 disappears and the ingot 11 is dislocated during pulling up, the ingot being pulled up is melted with the heater for experiment 38 and cooled to the room temperature, and then the crucible for experiment 34 is taken out from the main chamber 12 as well as taking out the solidified silicon from the crucible for experiment 34 to measure the deformation amount of the crucible for experiment 34.

Figure 1:
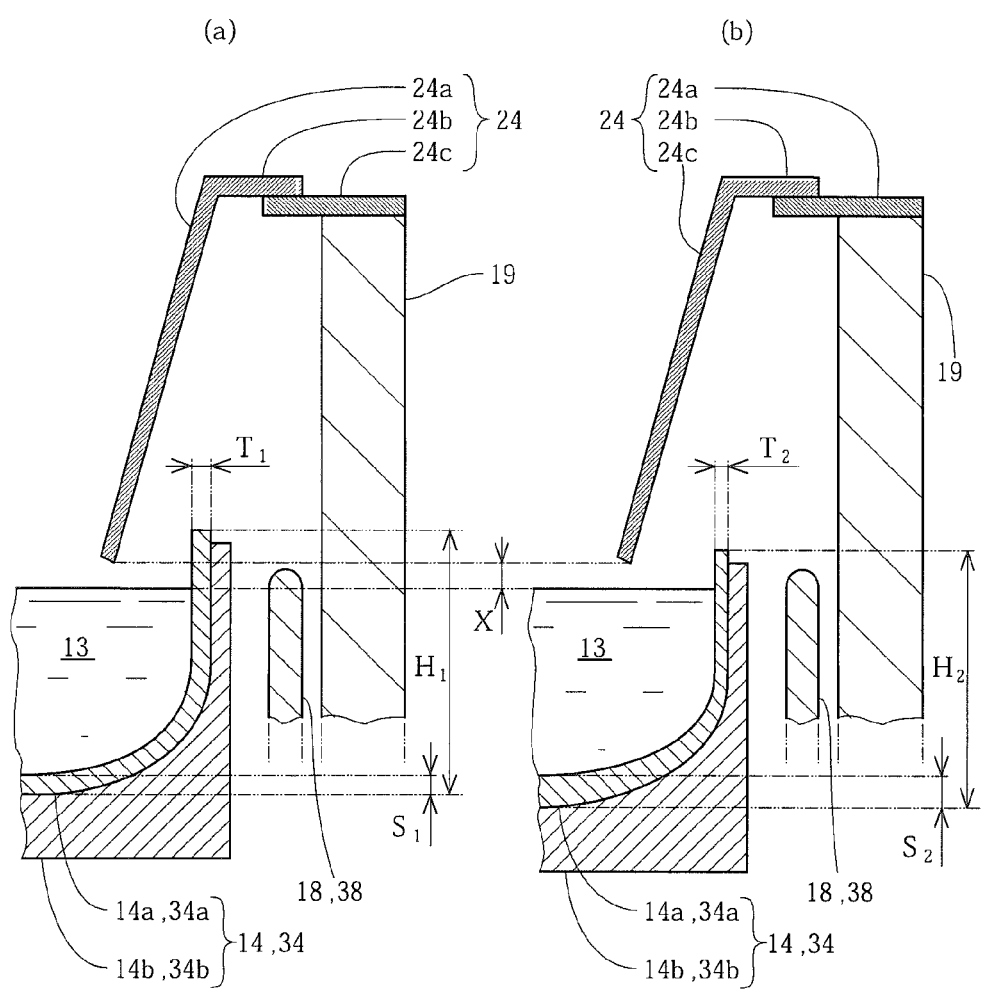
FIG. 1A is an enlarged cross section view of a section A in FIG. 2 illustrating the state of a silicon raw material supplied to a crucible of a pulling-up apparatus of an embodiment of the present invention before melted with a heater.
FIG. 1B is an enlarged cross section view of the section A in FIG. 2 illustrating the state of the silicon raw material after melted with the heater.

In this embodiment, only the deformation amount of the quartz crucible 34*a* with the large deformation amount is measured, while the deformation amount of the carbon crucible 34*b* with the small deformation amount is not measured. As illustrated in FIG. 1, where a height, a thickness of the perimeter wall, and the thickness of the bottom wall of the quartz crucible 34*a* before melting the silicon raw material are $H_1$, $T_1$, and $S_1$, respectively, and the height, the thickness of the perimeter wall, and the thickness of the bottom wall of the quartz crucible 34*a* after melting the silicon raw material or the ingot 11 being pulled up are $H_2$, $T_2$, and $S_2$, respectively, the height of the quartz crucible 34*a* after melting the silicon raw material or the ingot 11 being pulled up is lower than that before melting the silicon raw material or the ingot 11 being pulled up ($H_1 > H_2$), the thickness of the perimeter wall of the quartz crucible 34*a* after melting the silicon raw material or the ingot in being pulled up is thinner than that before melting the silicon raw material or the ingot 11 being pulled up ($T_1 > T_2$), and the thickness of the bottom wall of the quartz crucible 34*a* after melting the silicon raw material or the ingot 11 being pulled up is thicker than that before melting the silicon raw material or the ingot 11 being pulled up ($S_1 < S_2$). It is considered that this results from softening of the quartz crucible 34*a* upon melting the silicon raw material or the ingot 11 being pulled up with the heater for experiment 38, and the self-weight of the quartz crucible 34*a*. Then, a history of supply power to the heater for experiment 38 when melting the silicon raw material or the ingot 11 being pulled up, namely, change in the power supplied to the heater for experiment 38 with the time course, is measured. In consideration of variation in the size of the crucible for experiment 34 before melting the silicon raw material or the ingot 11 being pulled up, by changing the size of the crucible for experiment 34 within a range of the variation, or by changing the history of the supply power to the heater for experiment 38 upon melting the silicon raw material or the ingot 11 being pulled up, deformation tendency of the crucible for mass production 14 is calculated after melting for the first time the silicon raw material or the ingot 11 being pulled up. For example, the size of the crucible for experiment 34 before melting for the first time the silicon raw material or the ingot 11 being pulled up is used as a parameter, and a relation between the deformation amount of the crucible for experiment 34 and the history of the supply power to the heater for experiment 38 is memorized in a memory of a computer as a map. The deformation tendency of the crucible for mass production 14 after melting for the second time the ingot 11 being pulled up or the deformation tendency of the crucible for mass production 14 after melting for the third time or more the ingot 11 being pulled up is calculated as well in the similar way as above.

When a multiple pull-up method is performed in which a plurality of ingots 11 are pulled up using one crucible for mass production 14, e.g., when pulling up two ingots 11 subsequently using one crucible for mass production 14, after supplying the predetermined amount of the silicon raw material to the crucible for experiment 34 and melting the silicon raw material with the heater for experiment 38 to pull up the first ingot 11, the inside of the main chamber 12 is kept heated with the heater for experiment 38 while not being cooled to the room temperature and the remainder of the silicon melt 13 is kept stored in the quartz crucible 34*a*, and the silicon raw material is supplied again to the crucible for experiment 34 and the silicon raw material is melted with the heater for experiment 38. At this time, the silicon raw material is supplied again so that the total amount of the supplied silicon raw material and the remainder of the silicon melt 13 which remains in the crucible for experiment 34 would be the predetermined amount. Thereafter, the crucible for experiment 34 being cooled to the room temperature is taken out from the main chamber 12 as well as the solidified silicon being taken out from the crucible for experiment 34 to measure the deformation amount of the crucible for experiment 34. The history of the supply power to the heater for experiment 38 upon melting the silicon raw material is also measured. In consideration of variation in the size of the crucible for experiment 34 before melting the silicon, by changing the size of the crucible for experiment 34 within a range of the variation, or by changing the history of the supply power to the heater for experiment 38 upon melting the silicon raw material, the deformation tendency of the crucible for mass production 14 is calculated after melting for the second time the silicon raw material.

Meanwhile, when pulling up three ingots 11 subsequently using one crucible for mass production 14, after supplying the predetermined amount of the silicon raw material to the crucible for experiment 34 and melting the silicon raw material with the heater for experiment 38 to pull up the first ingot 11, the inside of the main chamber 12 is kept heated with the heater for experiment 38 while not being cooled to the room temperature and the remainder of the silicon melt 13 is kept stored in the quartz crucible 34a, the silicon raw material is supplied again to the crucible for experiment 34 and the silicon raw material is melted with the heater for experiment 38 to pull up the second ingot 11, and then the inside of the main chamber 12 is kept heated with the heater for experiment 38 while not being cooled to the room temperature and the remainder of the silicon melt 13 is kept stored in the quartz crucible 34a, the silicon raw material is supplied again to the crucible for experiment 34 and the silicon raw material is melted with the heater for experiment 38 to pull up the third ingot 11. The silicon raw material is supplied again so that the total amount of the supplied silicon raw material of the remainder of the silicon melt 13, which remains in the crucible for experiment 34, would be the predetermined amount. Thereafter, the crucible for experiment 34 being cooled to the room temperature is taken out from the main chamber 12 as well as the solidified silicon being taken out the solidified silicon from the crucible for experiment 34 to measure the deformation amount of the crucible for experiment 34. The history of the supply power to the heater for experiment 38 upon melting the silicon raw material is also measured. In consideration of variation in the size of the crucible for experiment 34 before melting the silicon, by changing the size of the crucible for experiment 34 within a range of the variation, or by changing the history of the supply power to the heater for experiment 38 upon melting the silicon raw material, the deformation tendency of the crucible for mass production 14 is calculated after melting for the third time the silicon raw material. In order to pull up four or more ingots 11 using one crucible for mass production 14, the deformation tendency of crucible for mass production 14 after melting the silicon raw material is calculated subsequently for the maximum number of the ingots 11 which can be pull up by a multiple pull-up method.

Subsequently, after measuring the size of crucible for mass production 14, the crucible for mass production 14 and the heater for mass production 18 are installed in the main chamber 12, and the predetermined amount of the silicon raw material, namely, the silicon raw material of the amount equivalent to that supplied to the crucible for experiment, is supplied to the crucible for mass production 14. The predetermined amount of the silicon raw material supplied to the crucible for mass production 14 is melted with the heater for mass production 18 to measure the storage amount of the silicon melt 13, as well as the history of the supply power to the heater for mass production 18 upon melting the silicon raw material being measured. Next, the crucible for mass production 14 is moved in the vertical direction to locate the surface of the silicon melt 13 below the lower end of the heat shield member 24 with the predetermined gap X therewith (FIG. 1), and an initial crucible external position of the crucible for mass production 14 at this time, namely, the position of the crucible for mass production 14 with respect to the vertical direction, is measured. Specifically, the position of the upper end of the crucible for mass production 14 with respect to the vertical direction is measured from the outside of the main chamber 12 using a CCD camera or the like. The deformation amount of the crucible for mass production 14 upon melting the silicon raw material is predicted based on the deformation tendency of the crucible for mass production 14 calculated from the crucible for experiment 34 and the heater for experiment 38, the measured size of the crucible for mass production 14, the measured storage amount of the silicon melt 13, the measured history of the supply power to the heater for mass production 18, and the measured initial crucible external position after melting the silicon raw material. An initial crucible internal position inside the crucible for mass production 14 with respect to the vertical position when the predetermined gap X is provided is predicted based on the predetermined deformation amount of the crucible for mass production 14, and an optimal pulling-up speed V of the ingot 11, with which the ingot 11 would be defect-free, is predictively calculated based on the measured initial crucible external position and the predicted initial crucible internal position. Specifically, when melting the predetermined amount of the silicon raw material supplied to the crucible for mass production 14 with the heater for mass production 18, the perimeter wall of the quartz crucible 14a of the crucible for mass production 14 becomes thinner and the height thereof becomes lower as well as the bottom wall of the quartz crucible 14a becoming thicker, namely, the initial crucible internal position changes, so that the position of the crucible for mass production 14 in the vertical direction to the heater for mass production 18 is shifted even when the spacing between the surface of the silicon melt 13 and the lower end of the heat shield member 24 is set to be the predetermined gap X provided (FIG. 1), resulting in the change in temperature gradient G in the axial direction near a solid-liquid interface of the silicon melt 13 and the ingot 11. Therefore, the pulling-up speed V of the ingot 11 is predictively calculated so that a ratio V/G of the pulling-up speed V of the ingot 11 and the temperature gradient G in the axial direction near the solid-liquid interface of the silicon melt 13 and the ingot 11 would be the optimal value for pulling up the defect-free ingot 11. The pulling-up speed is set as the setup pulling-up speed to initiate the pull-up of the ingot 11.

During pulling up the ingot 11 at the setup pulling-up speed, the change in the diameter of the ingot 11 and the change in the position of the surface of the silicon melt 13 in the vertical direction are measured for every predetermined time. The change in the diameter of the ingot 11 and the change in the position of the surface of the silicon melt 13 in the vertical direction are measured from the outside of the main chamber 12 using the CCD camera or the like. By measuring the change in the position of the surface of the silicon melt 13 in the vertical direction, the change in the gap X between the surface of the silicon melt 13 and the lower end of the heat shield member 24 can be calculated. Based on the change in the diameter of the ingot 11 and the change in the position of the surface of the silicon melt 13 in the vertical direction, the setup pulling-up speed is modified. The ingot 11 is pulled up at the modified setup pulling-up speed. Until the pull-up of the first ingot 11 is completed, the step of measuring the change in the diameter of the ingot 11 and the change in the position of the surface of the silicon melt 13, the step of modifying the setup pulling-up speed, and the step of pulling up the ingot 11 at the modified setup pulling-up speed are repeated. As a result, the ingot 11, which is defect-free over the entire length of the ingot 11, can be pulled up, so that it can prevent the defective ingot 11 being generated.

Figure 3:
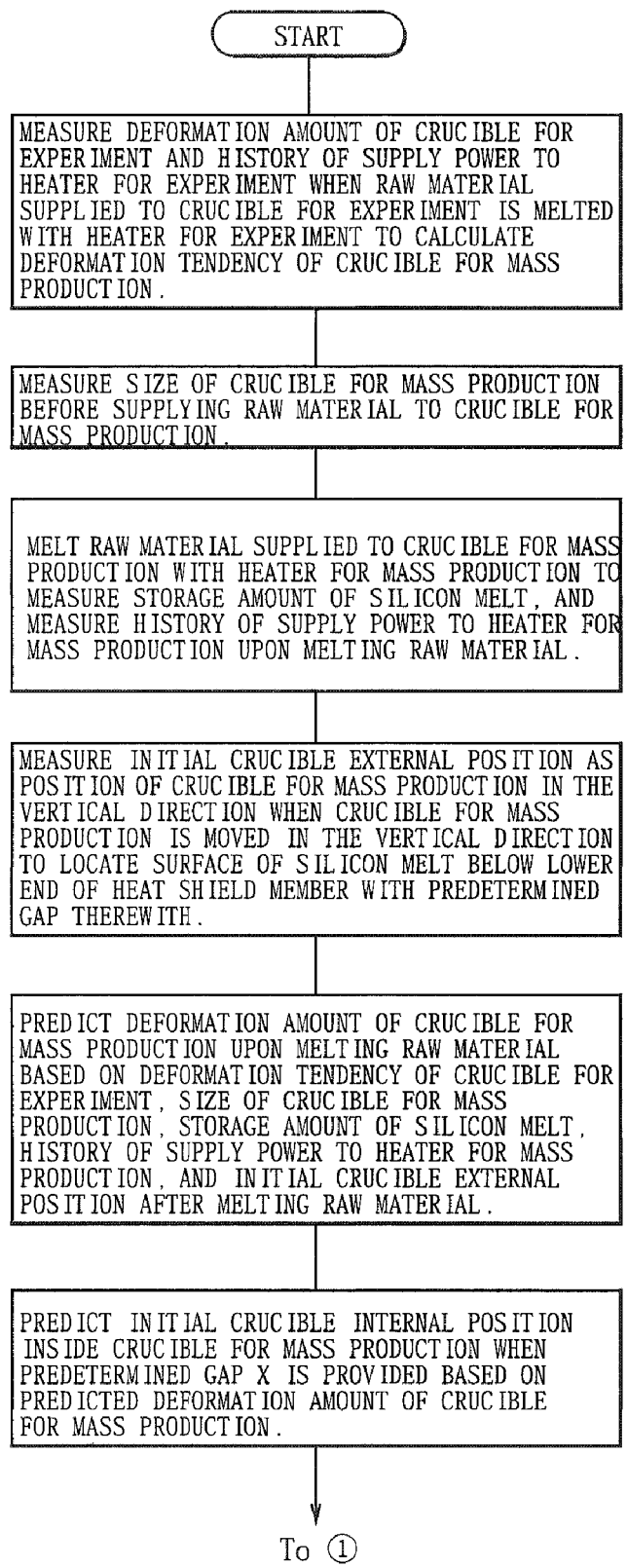
FIG. 3 is a flowchart illustrating a first stage of a method for manufacturing silicon single crystal of the present invention.
Figure 4:
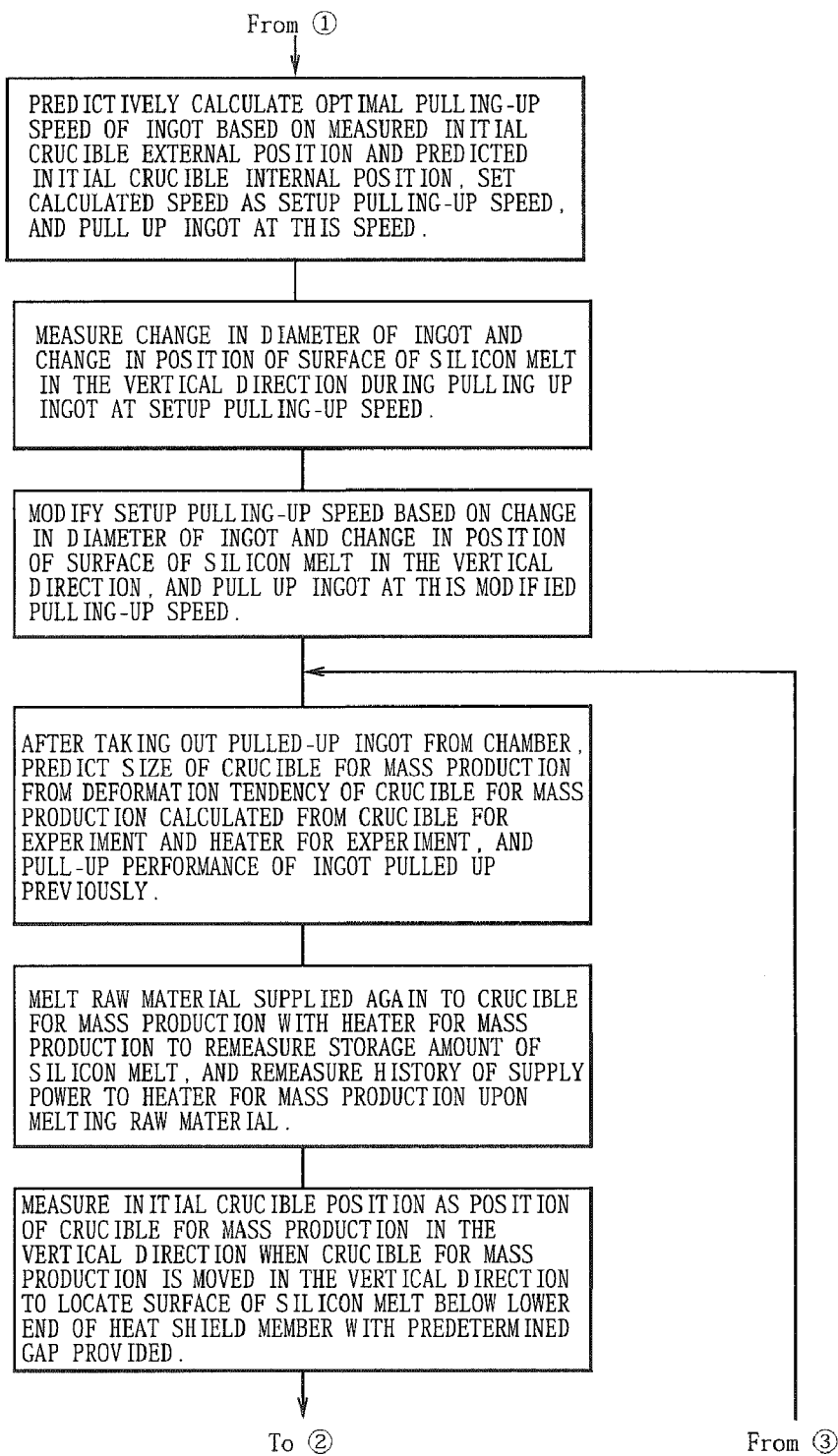
FIG. 4 is a flowchart illustrating a middle stage of the method for manufacturing the silicon single crystal of the present invention.
Figure 5:
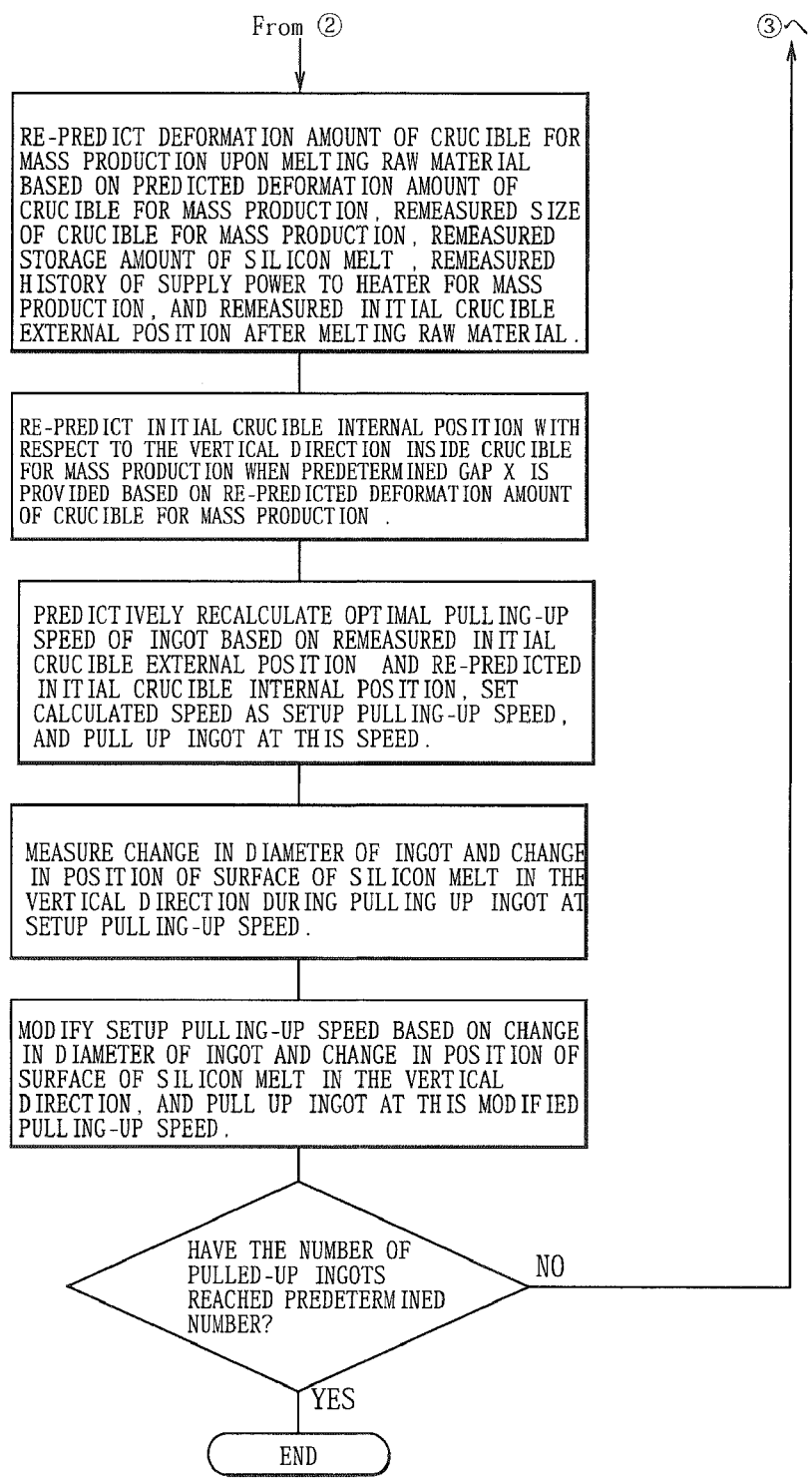
FIG. 5 is a flowchart illustrating a last stage of the method for manufacturing the silicon single crystal of the present invention.

Although not described in flowcharts of FIGS. 3 to 5, when the crystal habit line on the perimeter of the ingot 11 disappears and the ingot 11 is dislocated during pulling up the first ingot 11, the ingot 11 being pulled up is melted with the heater for mass production 18 and the ingot 11 is pulled up again from the silicon melt 13. In this case, the deformation amount of the crucible for mass production 14 upon melting the ingot 11 being pulled up is predicted firstly from the deformation tendency of the crucible for mass production 14, the size of the crucible for mass production 14, the storage amount of the silicon melt 13, the history of the supply power to the heater for mass production 18, and the initial crucible external position after melting the ingot 11 being pulled up. Next, the initial crucible internal position when the predetermined gap X is provided is predicted based on the predicted deformation amount of the crucible for mass production 14, and the optimal pulling-up speed for pulling up the defect-free ingot 11 is predictively calculated using the computer based on the initial crucible external position and the initial crucible internal position. In addition, the optimal pulling-up speed is set as the setup pulling-up speed to initiate the pull-up of the ingot 11. Consequently, even when the ingot 11 is dislocated during the pull-up and the ingot 11 is remelted with the heater for mass production 18, the pull-up of the ingot 11 is resumed at the pulling-up speed in consideration of the deformation of the crucible for mass production 14 upon this melting, so that it can prevent the defective ingot 11 being generated.

When pulling up the second ingot 11 using again the crucible for mass production 14 used for pulling up the first ingot 11 after pulling up the first ingot 11, the inside of the main chamber 12 is kept heated with the heater for mass production 18 while not being cooled to the room temperature and the remainder of the silicon melt 13 is kept stored in the quartz crucible 14a, and the deformation amount of the crucible for mass production 14 is predicted from the deformation tendency of the crucible for mass production 14 calculated using the crucible for experiment 34 and the heater for experiment 38 and the pull-up performance of the ingot 11 pulled up in a previous batch (first batch). Subsequently, the silicon raw material is supplied again to the crucible for mass production 14, and the silicon raw material supplied again is melted with the heater for mass production 18 to measure the storage amount of the silicon melt 13, as well as the history of the supply power to the heater for mass production 18 upon melting the silicon raw material being measured. The silicon raw material is supplied again so that the total amount of the supplied silicon raw material and the remainder of the silicon melt 13, which remains in the crucible for mass production 14, would be the predetermined amount. Next, the crucible for mass production 14 is moved in the vertical direction to locate the surface of the silicon melt 13 below the lower end of the heat shield member 24 with the predetermined gap X therewith, and the initial crucible external position of the crucible for mass production 14 at this time, namely, the initial crucible external position with respect to the vertical direction outside the crucible for mass production 14, is remeasured. The deformation amount of the crucible for mass production 14 upon melting the silicon raw material is re-predicted based on the predicted deformation amount of the crucible for mass production 14, the remeasured storage amount of the silicon melt 13, the history of the remeasured supply power to the heater for mass production 18, and the remeasured initial crucible external position after melting the silicon raw material. Moreover, the initial crucible internal position with respect to the vertical direction inside the crucible for mass production 14 when the predetermined gap X is provided is re-predicted based on the re-predicted deformation amount of the crucible for mass production 14, the optimal pulling-up speed of the ingot 11 is predictively recalculated based on the remeasured initial crucible external position and the re-predicted initial crucible internal position to set the setup pulling-up speed, and initiate the pull-up of the ingot 11 at the setup pulling-up speed.

During pulling up the ingot 11 at the setup pulling-up speed, the change in the diameter of the ingot 11 and the change in the position of the surface of the silicon melt 13 in the vertical direction are measured for every predetermined time. The setup pulling-up speed is modified based on the change in the diameter of the ingot 11 and the change in the position of the surface of the silicon melt 13 in the vertical direction. The ingot 11 is pulled up at the modified setup pulling-up speed. Until the pull-up of the second ingot 11 is completed, the step of measuring the change in the diameter of the ingot 11 and the change in the position of the surface of the silicon melt 13, the step of modifying the setup pulling-up speed, and the step of pulling up the ingot 11 at the modified setup pulling-up speed are repeated. The pull-up of the third or more ingots 11 is performed similarly as above. As a result, even when the pull-up of the plurality of ingots 11 are performed by the multiple pull-up method, all the ingots 11 are defect-free over the entire length, and thus the plurality of ingots having the quality equivalent to that of the ingot pulled up for the first time can be pulled up, namely, it can prevent the defective ingot 11 being generated for all the ingots 11.

What is claimed is:

1. A method for the mass production of a silicon single crystal comprising supplying a predetermined amount of a silicon raw material to a mass production crucible (14) of a silicon single crystal pulling-up apparatus (10), followed by melting the silicon raw material with a heater (18) to produce a silicon melt (13) in the mass production crucible (14), pulling up a silicon single crystal ingot (11) from the silicon melt (13) in the mass production crucible (14), and encircling the ingot (11) being pulled up by a heat shield member (24) disposed above the surface of the silicon melt (13) with a predetermined gap (X) therewith, comprising the steps of:

calculating the deformation tendency of the mass production crucible (14) by measuring the deformation amount of an experimental crucible (34) and the history of supply power to an experimental heater (38) when the silicon raw material of the amount equivalent to the amount supplied to the mass production crucible is supplied to the experimental crucible (34) having a shape and size equivalent to that of the mass production crucible (14) and then melting the silicon raw material with the experimental heater (38) having a shape and size equivalent to that of the mass production heater (18);

measuring the size of the mass production crucible (14) before supplying the silicon raw material to the mass production crucible (14);

measuring the storage amount of the silicon melt (13) by melting the predetermined amount of the silicon raw material supplied to the mass production crucible (14) with the mass production heater (18), and measuring the history of the supply power to the mass production heater (18) upon melting the silicon raw material;

measuring the initial crucible external position with respect to the vertical direction external to the mass production crucible (14) when the mass production crucible (14) is moved in the vertical direction to locate the surface of the silicon melt (13) below the bottom end of the heat shield member (24) with the predetermined gap (X) therewith;

predicting the deformation amount of the mass production crucible (14) upon melting the silicon raw material based on the deformation tendency of the mass production crucible (14) calculated by the experimental crucible (34) and the experimental heater (38), the size of the mass production crucible (14), the storage amount of the silicon melt (13), the history of the supply power to the mass production heater (18), and the initial crucible external position after melting the silicon raw material;

predicting an initial crucible internal position with respect to the vertical direction internal to the mass production crucible (14) when the predetermined gap (X) is provided based on the predicted deformation amount of the mass production crucible (14);

setting a setup pulling-up speed by predictively calculating an optimal pulling-up speed of the ingot (11) based on the measured initial crucible external position and the predicted initial crucible internal position; and initiating the pulling-up of the ingot (11) at the setup pulling-up speed.

2. The method according to claim 1, further comprising the steps of:

measuring the change in a diameter of the ingot (11) and change in a position of the surface of the silicon melt (13) in the vertical direction during pulling up the ingot (11) at the setup pulling-up speed;

modifying the setup pulling-up speed based on the change in the diameter of the ingot (11) and the change in the position of the surface of the silicon melt (13) in the vertical direction;

pulling up the ingot (11) at the modified setup pulling-up speed; and repeating the measurement step, the modification step, and the pulling-up step during pulling up of the ingot (11).

3. The method according to claim 2 comprising the steps of:

when an ingot crystal is dislocated during pulling up the first ingot (11), remelting the ingot (11) being pulled up with the mass production heater (18) to remeasure the storage amount of the silicon melt (13) and measuring a history of the supply power to the mass production heater (18) upon melting the ingot (11) being pulled up;

measuring an initial crucible external position with respect to the vertical direction external to the mass production crucible (14) when the mass production crucible (14) is moved in the vertical direction to locate the surface of the silicon melt (13) below a bottom end of the heat shield member (24) with a predetermined gap (X) therewith;

predicting a deformation amount of the mass production crucible (14) upon melting the ingot (11) being pulled up based on the deformation tendency of the mass production crucible (14) calculated by the experimental crucible (34) and the experimental heater (38), the size of the mass production crucible (14), the storage amount of the silicon melt (13), the history of the supply power to the mass production heater (18), and the initial crucible external position after melting the ingot (11) being pulled up;

predicting an initial crucible internal position with respect to the vertical direction internal to the mass production crucible (14) when the predetermined gap (X) is provided based on the predicted deformation amount of the crucible for mass production (14);

setting a setup pulling-up speed by predictively calculating an optimal pulling-up speed of the ingot (11) based on the measured initial crucible external position and the predicted mass production initial crucible internal position; and initiating pull-up of the ingot (11) at the setup pulling-up speed.

4. The method according to claim 3 followed by pulling up a second, third or more ingots (11) using the mass production crucible for (14) used for pulling up the first ingot (11), comprising the steps of:

predicting a deformation amount of the mass production crucible (14) from the deformation tendency of the mass production crucible (14) calculated from an experimental crucible (34) and an experimental heater (38), and from pull-up performance of the ingot (11) pulled up previously;

remeasuring a storage amount of the silicon melt (13) by resupplying a silicon raw material to the mass production crucible (14) and melting the silicon raw material with the mass production heater (18), and remeasuring a history of supply power to the mass production heater (18) upon melting the silicon raw material;

remeasuring an initial crucible external position with respect to the vertical direction external to the mass production crucible (14) when the mass production crucible (14) is moved in the vertical direction to locate the surface of the silicon melt (13) below a bottom end of the heat shield member (24) with a predetermined gap (X) therewith;

re-predicting the deformation amount of the mass production crucible (14) upon melting the silicon raw material based on the predicted deformation amount of the mass production crucible (14), the remeasured storage amount of the silicon melt (13), the history of the remeasured supply power to the mass production heater (18), and the remeasured initial crucible external position after melting the remeasured silicon raw material;

re-predicting an initial crucible internal position with respect to the vertical direction internal to the mass production crucible (14) when the predetermined gap (X) is provided based on the re-predicted deformation amount of the mass production crucible (14);

setting a setup pulling-up speed by predictively calculating again an optimal pulling-up speed of the ingot (11) based on the remeasured initial crucible external position and the re-predicted initial crucible internal position; and initiating pulling-up of the ingot (11) at the setup pulling-up speed.

5. The method according to claim 4, further comprising the steps of:

measuring the change in a diameter of the ingot (11) and change in a position of the surface of the silicon melt (13) in the vertical direction during pulling up the ingot (11) at the setup pulling-up speed;

modifying the setup pulling-up speed based on the change in the diameter of the ingot (11) and the change in the position of the surface of the silicon melt (13) in the vertical direction;

pulling up the ingot (11) at the modified setup pulling-up speed; and repeating the measurement step, the modification step, and the pulling-up step during pulling up of the ingot (11).

6. The method according to claim 2 followed by pulling up a second, third or more ingots (11) using the mass production crucible for (14) used for pulling up the first ingot (11), comprising the steps of:

predicting a deformation amount of the mass production crucible (14) from the deformation tendency of the mass production crucible (14) calculated from an experimental crucible (34) and an experimental heater (38), and from pulling-up performance of the ingot (11) pulled up previously;

remeasuring a storage amount of the silicon melt (13) by resupplying a silicon raw material to the mass production crucible (14) and melting the silicon raw material with the mass production heater (18), and remeasuring a history of supply power to the mass production heater (18) upon melting the silicon raw material;

remeasuring an initial crucible external position with respect to the vertical direction external to the mass production crucible (14) when the mass production crucible (14) is moved in the vertical direction to locate the surface of the silicon melt (13) below a bottom end of the heat shield member (24) with a predetermined gap (X) therewith;

re-predicting the deformation amount of the mass production crucible (14) upon melting the silicon raw material based on the predicted deformation amount of the mass production crucible (14), the remeasured storage amount of the silicon melt (13), the history of the remeasured supply power to the mass production heater (18), and the remeasured initial crucible external position after melting the remeasured silicon raw material;

re-predicting an initial crucible internal position with respect to the vertical direction internal to the mass production crucible (14) when the predetermined gap (X) is provided based on the re-predicted deformation amount of the mass production crucible (14);

setting a setup pulling-up speed by predictively calculating again an optimal pulling-up speed of the ingot (11) based on the remeasured initial crucible external position and the re-predicted initial crucible internal position; and initiating pulling-up of the ingot (11) at the setup pulling-up speed.

7. The method according to claim 6, further comprising the steps of:

measuring the change in a diameter of the ingot (11) and change in a position of the surface of the silicon melt (13) in the vertical direction during pulling up the ingot (11) at the setup pulling-up speed;

modifying the setup pulling-up speed based on the change in the diameter of the ingot (11) and the change in the position of the surface of the silicon melt (13) in the vertical direction;

pulling up the ingot (11) at the modified setup pulling-up speed; and repeating the measurement step, the modification step, and the pulling-up step during pulling up of the ingot (11).

8. The method according to claim 1, followed by pulling up a second, third, or more ingots (11) using the mass production crucible (14) used for pulling up the first ingot (11), comprising the steps of:

predicting a deformation amount of the mass production crucible (14) from deformation tendency of the mass production crucible (14) calculated from an experimental crucible (34) and an experimental heater (38), and from pull-up performance of the ingot (11) pulled up previously;

remeasuring a storage amount of the silicon melt (13) by resupplying a silicon raw material to the mass production crucible (14) and melting the silicon raw material with the mass production heater (18), and remeasuring a history of supply power to the mass production heater (18) upon melting the silicon raw material;

remeasuring an initial crucible external position with respect to the vertical direction external to the mass production crucible (14) when the mass production crucible (14) is moved in the vertical direction to locate the surface of the silicon melt (13) below a bottom end of the heat shield member (24) with a predetermined gap (X) therewith;

re-predicting the deformation amount of the mass production crucible (14) upon melting the silicon raw material based on the predicted deformation amount of the mass production crucible (14), the remeasured storage amount of the silicon melt (13), the history of the remeasured supply power to the mass production heater (18), and the remeasured initial crucible external position after melting the remeasured silicon raw material;

re-predicting an initial crucible internal position with respect to the vertical direction internal to the mass production crucible (14) when the predetermined gap (X) is provided based on the re-predicted deformation amount of the mass production crucible (14);

setting a setup pulling-up speed by predictively calculating again an optimal pulling-up speed of the ingot (11) based on the remeasured initial crucible external position and the re-predicted initial crucible internal position; and initiating pull-up of the ingot (11) at the setup pulling-up speed.

9. The method according to claim 8, further comprising the steps of:

measuring change in a diameter of the ingot (11) and change in a position of the surface of the silicon melt (13) in the vertical direction during pulling up the ingot (11) at the setup pulling-up speed;

modifying the setup pulling-up speed based on the change in the diameter of the ingot (11) and the change in the position of the surface of the silicon melt (13) in the vertical direction;

pulling up the ingot (11) at the modified setup pulling-up speed; and repeating the measurement step, the modification step, and the pull-up step during pulling up the ingot (11).

* * * * *